12) United States Patent
Yu et al.

(10) Patent No.: US 7,163,889 B2
(45) Date of Patent: Jan. 16, 2007

(54) FILM FOR COPPER DIFFUSION BARRIER (75) Inventors: Yongsik Yu, Lake Oswego, OR (US);
Karen Billington, Beaverton, OR (US);
Robert Hepburn, Tualatin, OR (US);
Michael Carris, Tualatin, OR (US);
William Crew, Portland, OR (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/234,808

(22) Filed: Sep. 23, 2005

(65) Prior Publication Data

US 2006/0019486 A1 Jan. 26, 2006

Related U.S. Application Data (62) Division of application No. 10/670,660, filed on Sep. 24, 2003, now Pat. No. 6,967,405.

(51) Int. Cl.
*H01L 21/4763* (2006.01)
(52) U.S. Cl. ................ 438/627; 438/643; 257/E21.584
(58) Field of Classification Search ................ 438/627, 438/643
See application file for complete search history.

(56) References Cited

U.S. PATENT DOCUMENTS

| 4,656,110 | A | 4/1987 | Yamazaki |
| 5,324,690 | A | 6/1994 | Gelatos et al. ............... 438/634 |
| 5,654,208 | A | 8/1997 | Harris et al. |
| 5,739,579 | A | 4/1998 | Chiang et al. ............... 257/635 |
| 6,100,587 | A | 8/2000 | Merchant et al. |
| 6,197,688 | B1 | 3/2001 | Simpson ..................... 438/678 |
| 6,399,484 | B1 | 6/2002 | Yamasaki et al. ........... 438/648 |
| 6,417,092 | B1 | 7/2002 | Jain et al. ................... 438/624 |
| 6,424,044 | B1 | 7/2002 | Han et al. ................... 257/758 |
| 6,774,489 | B1 | 8/2004 | Russell et al. .............. 257/752 |
| 6,790,767 | B1 | 9/2004 | Lee ........................... 438/627 |
| 2003/0001275 | A1 | 1/2003 | Sambucetti et al. ........ 257/762 |
| 2003/0057553 | A1 | 3/2003 | DelaRosa et al. .......... 257/751 |
| 2003/0068881 | A1 | 4/2003 | Xia et al. |
| 2003/0082296 | A1 | 5/2003 | Elers et al. .................... 427/96 |
| 2003/0232514 | A1 | 12/2003 | Kim et al. .................. 438/791 |
| 2004/0124531 | A1 | 7/2004 | Venkatraman et al. ...... 257/751 |
| 2004/0207084 | A1 | 10/2004 | Hedrick et al. ............. 257/751 |

OTHER PUBLICATIONS

U.S. Office Action mailed May 3, 2006, from U.S. Appl. No. 10/915,117.

(Continued)

*Primary Examiner*—W. David Coleman
(74) *Attorney, Agent, or Firm*—Beyer Weaver & Thomas LLP (57) ABSTRACT The present invention provides a low dielectric constant copper diffusion barrier film suitable for use in a semiconductor device and methods for fabricating such a film. Some embodiments of the film are formed of a silicon-based material doped with boron. Other embodiments are formed, at least in part, of boron nitride. Some such embodiments include a moisture barrier film that includes oxygen and/or carbon. Preferred embodiments of the copper diffusion barrier maintain a stable dielectric constant of less than 4.5 in the presence of atmospheric moisture.

14 Claims, 6 Drawing Sheets

OTHER PUBLICATIONS

Yu, et al., "Low-K SIC Copper Diffusion Barrier Films", Novellus Systems, Inc., U.S. Appl. No. 10/869,474, filed Jun. 15, 2004, pp. 1-25.

Yu, et al., "Low-K B-Doped SIC Copper Diffusion Barrier Films", Novellus Systems, Inc., U.S. Appl. No. 10/915,117, filed Aug. 9, 2004, pp. 1-22.

Masahiko Maeda, et al., "A Low-Permittivity Interconnection Using an SiBN Interlayer", Sep. 1989, IEEE Transactions on Electron Devices, vol. 36, No. 9.

Takashi Sugino, et al., "Synthesis of boron nitride film with low dielectric constant for its application to silicon ultralarge scale integrated semiconductors", 2001 Elsevier Science B.V., Diamond and Related Materials 1275-1379.

FILM FOR COPPER DIFFUSION BARRIER

CROSS REFERENCE TO RELATED APPLICATION

This application is a divisional of U.S. patent application Ser. No. 10/670,660, entitled "NOVEL FILM FOR COPPER DIFFUSION BARRIER" and filed on Sep. 24, 2003, now U.S. Pat. No. 6,967,405.

BACKGROUND

This invention relates to low dielectric constant layers for use in various applications. The invention also relates to methods of forming low dielectric constant layers in a wide range of VLSI fabrication operations.

As the features of microelectronic integrated circuits devices are reduced to smaller sizes, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnect.

These difficulties can be mitigated by preparing the circuit using an inter-layer dielectric ("ILD") having a dielectric constant that is as low as possible. For integrated circuits that are fabricated using a damascene or dual damascene method, the ILD is composed of an insulating material and a copper diffusion barrier film. Although it is important for both the insulating material and the copper diffusion barrier film to be formed of materials having a low dielectric constant, the present application is mainly directed to methods and devices for producing a copper diffusion barrier film having a low dielectric constant.

Silicon nitride provides a film having satisfactory properties as a copper diffusion barrier, but its dielectric constant is relatively high. Therefore, some prior art has involved doping silicon nitride with a material having a lower dielectric constant. For example, some previous methods for producing a copper diffusion barrier with a low dielectric constant have involved doping silicon nitride with boron. Although boron-doped silicon nitride has a lower dielectric constant than pure silicon nitride, it has proven to be unstable in the presence of atmospheric moisture. Over time, the dielectric constant of boron-doped silicon nitride tends to increase, rapidly becoming unsuitable for use as a low dielectric constant copper diffusion barrier. Improved materials and processing are required.

SUMMARY OF THE INVENTION

The present invention provides a low dielectric constant copper diffusion barrier film suitable for use in a semiconductor device and the methods for fabricating such a film. Some embodiments of the film are formed of a silicon-based material doped with boron. Other embodiments are formed, at least in part, of boron nitride. Some such embodiments include a moisture barrier film that includes oxygen and/or carbon. Preferred embodiments of the copper diffusion barrier maintain a stable dielectric constant of less than 4.5 in the presence of atmospheric moisture.

Certain embodiments of the invention provide a copper diffusion barrier film for use in a semiconductor device. The copper diffusion barrier film is formed of a silicon-based material doped with boron and maintains a stable dielectric constant of less than 4.5 in the presence of atmospheric moisture. Some such embodiments of the copper diffusion barrier film maintain a stable dielectric constant of between 3.0 and 4.5 in the presence of atmospheric moisture, for example 3.5. The silicon-based material may include silicon nitride or silicon carbide.

The copper diffusion barrier film may include a first layer of boron-doped silicon nitride or silicon carbide and, a second boron-doped layer. The second layer includes silicon and one or more elements selected from the list of elements consisting of carbon, nitrogen and oxygen. The copper diffusion barrier film may have a thickness in the range of 100 Å to 1500 Å.

Other embodiments of the invention include a wholly or partially fabricated semiconductor device. The device includes a metal interconnect formed substantially of copper and a copper diffusion barrier adjacent the metal interconnect. The copper diffusion barrier is formed of a silicon-based material doped with boron. In some such devices, the copper diffusion barrier maintains a stable dielectric constant of between 3.0 and 4.5 in the presence of atmospheric moisture. The silicon-based material may be silicon nitride or silicon carbide.

The copper diffusion barrier in the device may include a first layer of boron-doped silicon nitride or silicon carbide and a second boron-doped layer. The second layer includes silicon and one or more elements selected from the list of elements consisting of carbon, nitrogen and oxygen. The copper diffusion barrier may have a thickness in the range of 100 Å to 1500 Å.

Still other embodiments of the invention provide another copper diffusion barrier film for use in a semiconductor device. The copper diffusion barrier film includes a first layer of boron nitride and a second layer. The second layer includes boron and one or more elements selected from the list of elements consisting of silicon, carbon, nitrogen and oxygen. The copper diffusion barrier film maintains a stable dielectric constant of less than 4.5 in the presence of atmospheric moisture.

Some aspects of the invention provide a method of forming at least a portion of a semiconductor device. The method includes the following steps: forming a trench in a first dielectric layer; depositing a metal diffusion barrier in the trench; depositing a copper seed layer on the metal diffusion barrier; forming a copper interconnect on the copper seed layer; and forming a copper diffusion barrier on the copper interconnect. The copper diffusion barrier is formed of a silicon-based material doped with boron.

The method may also include the step of removing copper oxide from the copper layer prior to forming the copper diffusion barrier on the copper layer. The removing step may involve exposing the copper layer to a gas selected from a list consisting of ammonia gas and hydrogen gas.

The step of forming a copper diffusion barrier may involve plasma-enhanced chemical vapor deposition ("PECVD") process. The PECVD process may involve flowing silane gas at rates in the range of approximately 50 to 300 standard cubic centimeters per minute, flowing a diborane gas mixture (e.g., 5% diborane gas in a 95% $N_2$ or 95% Ar mixture) at rates in the range of approximately 2000 to 10000 standard cubic centimeters per minute, flowing ammonia gas at rates in the range of approximately 250 to 2000 standard cubic centimeters per minute and/or flowing nitrogen gas at rates in the range of approximately 0 to 8000 standard cubic centimeters per minute. The PECVD process may be performed at temperatures in the range of approximately 200 degrees Centigrade to 400 degrees Centigrade, at pressures in the range of approximately 0.1 torr to 10 torr and/or at frequencies in the range of approximately 200 to 500 kHz. Alternatively, the PECVD process may be performed at a frequency of approximately 13.56 MHz or 27 MHz.

These and other features and advantages of the present invention will be described in more detail below with reference to the associated drawings.

DETAILED DESCRIPTION

Boron nitride films having a dielectric constant of approximately 2.7 have been prepared by atmospheric chemical vapor deposition ("CVD") at a high temperature. However, if exposed to air, these boron nitride films absorb moisture from the air and their dielectric constant increases substantially. Although boron-doped silicon nitride has a lower dielectric constant than pure silicon nitride, it has also proven to be unstable in the presence of atmospheric moisture. Over time, the dielectric constant of boron-doped silicon nitride tends to increase, rapidly becoming unsuitable for use as a copper diffusion barrier for the next generation of semiconductor device.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

The inventors have discovered that by carefully adjusting the stoichiometry between silicon nitride and boron nitride, plasma-deposited silicon boron nitride films having a dielectric constant of less than 4.5 can be formed. Surprisingly, these films have both good insulating properties and good moisture-blocking properties. Some such methods produce silicon boron nitride having a composition in the following ranges: $Si_{0.1-0.3}B_{0.2-0.6}N_{0.1-0.5}$. Some such methods produce silicon boron nitride having a composition of $Si_1B_2N_1$. Other methods produce silicon boron nitride having a composition of $Si_1B_3N_1$.

For example, during a plasma-enhanced chemical vapor deposition ("PECVD") process, diborane ($B_2H_6$) mixed with a noble gas such as argon (or nitrogen) is used as a boron source, silane ($SiH_4$) is used as a silicon source and ammonia ($NH_3$) and/or nitrogen (N2) is used as a nitrogen source. Those of skill in the art will realize that other substances may be used as boron, silicon and nitrogen sources. In some embodiments, borane complexes, such as dimethylamine borane and trimethyl borane, may be used for boron sources.

Some exemplary methods use a flow rate in the range of 2000 to 10000 standard cubic centimeters per minute (sccm) of the boron source, 50 to 300 sccm for the silicon source and 250 to 2000 sccm ammonia and/or 0 to 8000 sccm nitrogen for the nitrogen source. According to one such method, a diborane/argon mixture (5%/95%) was introduced at approximately 9000 sccm, silane gas was introduced at approximately 50 sccm and ammonia gas was introduced at approximately 500 sccm.

The PECVD process may be performed, for example, at temperatures in the range of 200 to 400 degrees Centigrade and at pressures in the range of 0.1 torr to 10 torr. The resulting film is preferably in the range of 100 angstroms to 1500 angstroms. The process may be conducted at relatively low frequencies (e.g., 200 to 500 kHz) or at relatively high frequencies (e.g., at approximately 13.56 MHz). Preferably, the copper is pretreated (e.g., with ammonia or hydrogen gas) before film deposition.

Alternative methods of the invention involve forming a silicon boron nitride layer, then forming a moisture barrier on the silicon boron nitride layer. According to some such methods, the moisture barrier is formed by adding a carbon source gas and/or an oxygen source gas during the PECVD process, thereby forming a moisture barrier of SiBNO, SiBCNO, or SiBCO. The carbon source and/or oxygen source may be added, for example, after the silicon boron nitride layer has reached a desired thickness or after a predetermined time. Some exemplary methods use 40 to 700 Å silicon boron nitride film for the bottom layer.

According to some such methods, ethylene is used as the carbon source and nitrous oxide or carbon dioxide is used as the oxygen source. However, other carbon and/or oxygen sources may be used. In some such methods, the carbon source is flowed at a rate in the range of 50 to 300 sccm and the oxygen source is flowed at a rate in the range of 50 to 300 sccm.

Dual Damascene Process Flow

Figure 1:
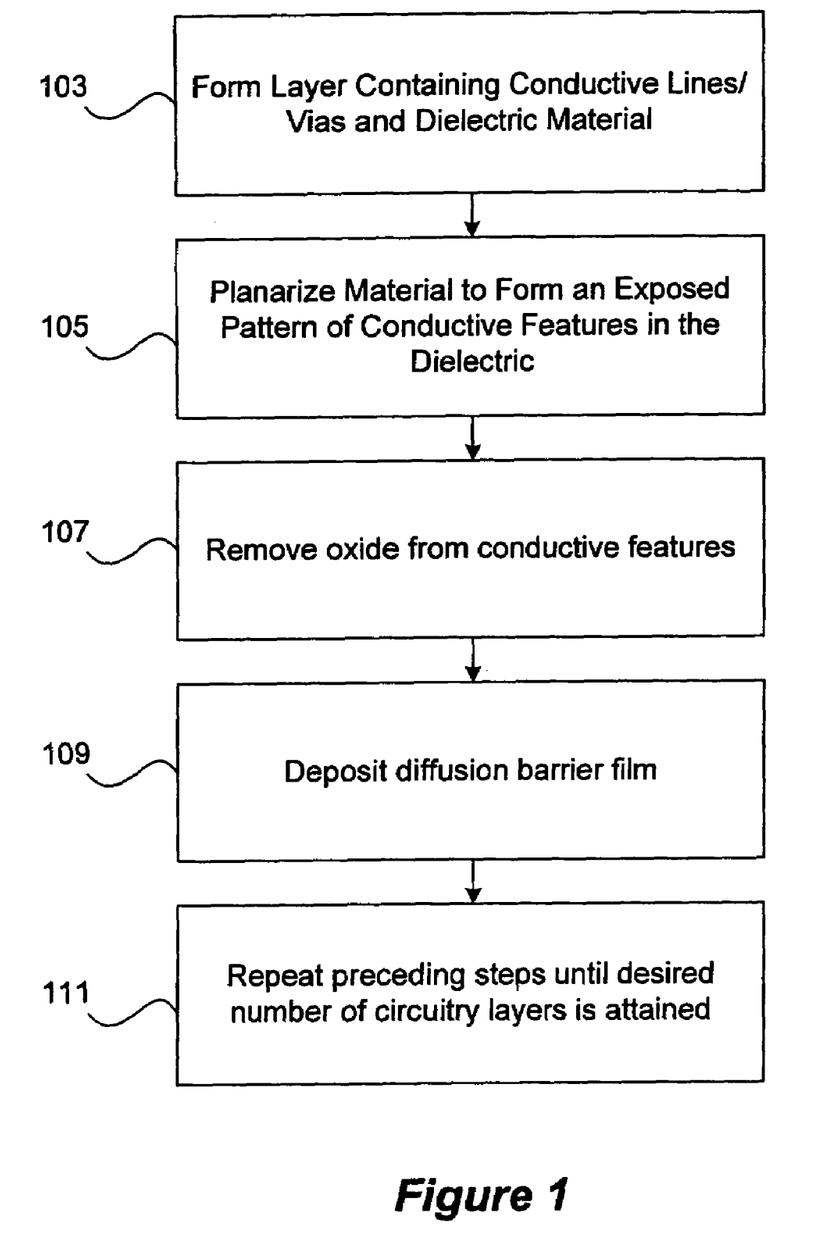
FIG. 1 is a process flow chart depicting a method in accordance with an embodiment of this invention.

The process flow for one general approach to this invention is depicted in the flow chart of FIG. 1. A generalized version of a dual damascene technique will be described below with reference to FIGS. 2A through 3, which depict a partially formed semiconductor device during various stages of this process.

As illustrated in FIG. 1, the process begins in step 103 with the formation of a layer on the semiconductor device. The layer comprises dielectric material with a pattern of conductive features disposed therein. These conductive features are typically, though not necessarily, metal lines and vias. In one example, they are the interconnects of a metallization layer that is formed from copper. In another example, they are a pattern of polysilicon at the gate level of a device. As is known to those of skill in the art, various techniques may be employed to form such layers.

Typically, as part of the process of forming this layer, excess material will have to be removed from the top (exposed surface) of the layer. As depicted in FIG. 1, this material is removed (step 105) by a planarization process to form an exposed pattern of conductive features in the dielectric. One widely-used planarization process is chemical mechanical polishing.

Particularly if the conductive layer includes copper, it is beneficial to remove oxides from the conductive layer after the planarization process (step 107). As known by those of skill in the art, this step may be accomplished by flowing a gas such as ammonia or hydrogen over the copper surfaces.

The next step (step 109) has been described in the first section of the detailed description of the invention. A diffusion barrier film, such as a copper diffusion barrier film, is deposited on the planarized surface of the partially-formed semiconductor device. This layer may serve other purposes aside from that of a diffusion barrier. For example, the diffusion barrier film may also act as an etch stop layer. Step 111 encompasses a repetition of all of the foregoing steps.

Figure 2A:
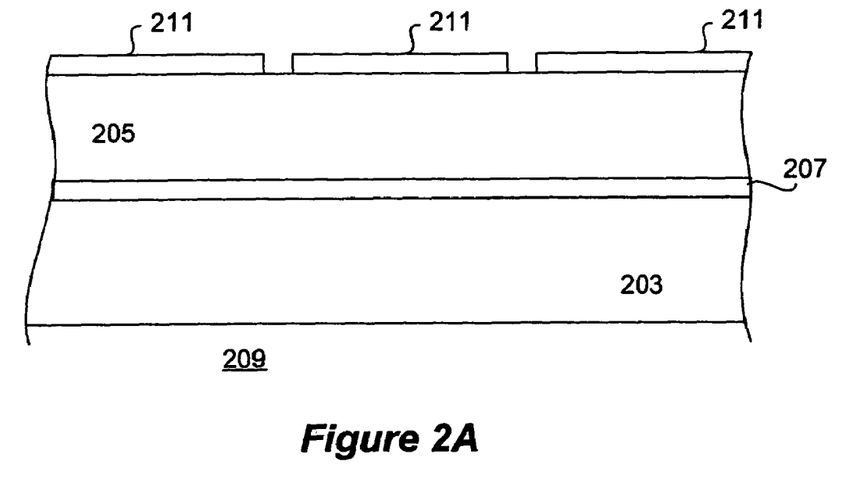
FIG. 2A is a cross sectional diagram of a dielectric layer prior to a via etch in a damascene process.
Figure 2B:
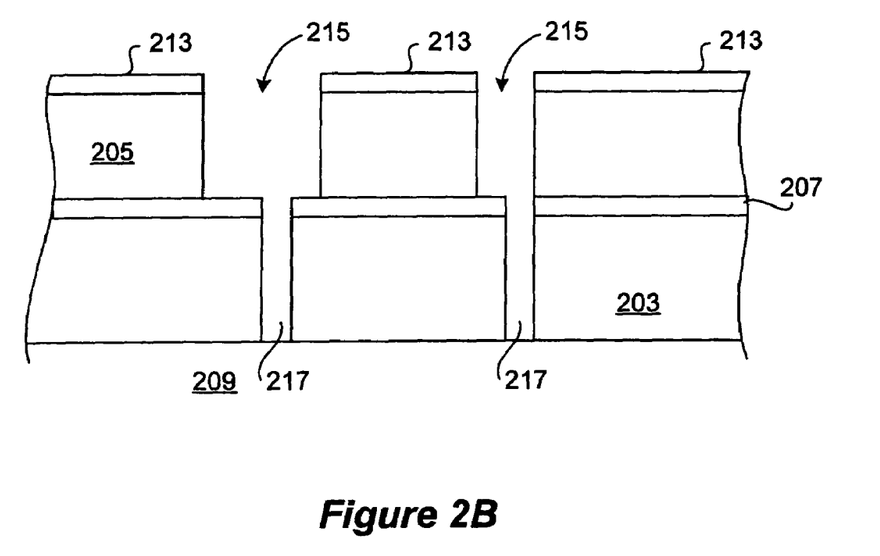
FIG. 2B is a cross sectional diagram of the dielectric layer of FIG. 2A after a line etch has been performed.
Figure 2C:
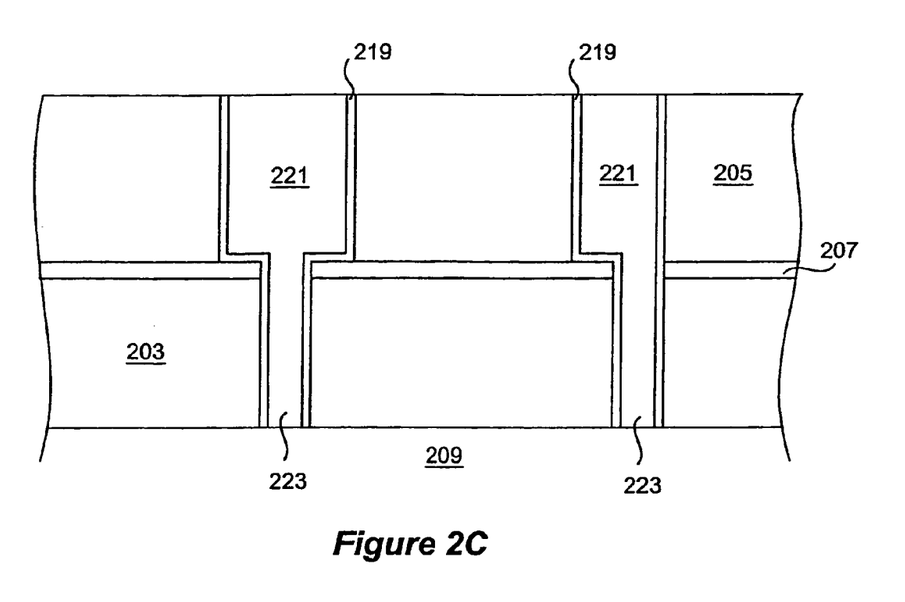
FIG. 2C is a cross sectional diagram of the dielectric layer of FIGS. 2A and 2B after the etched regions have been filled with metal to form lines and vias.
Figure 2D:
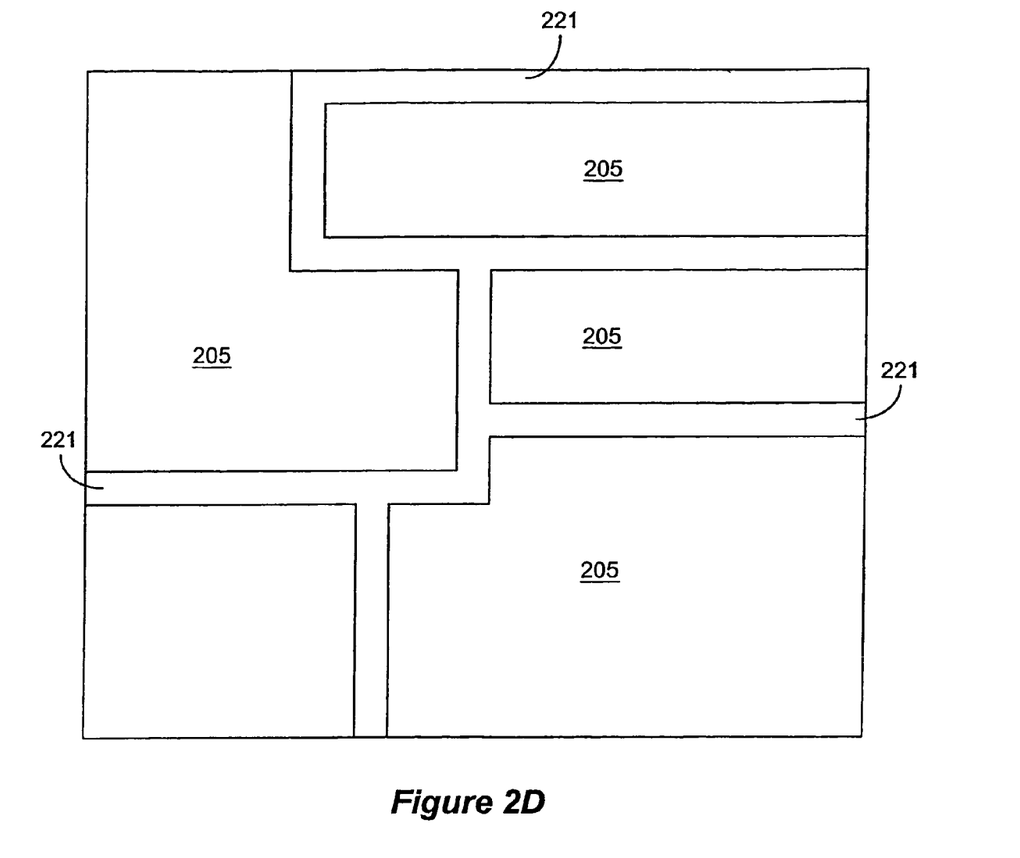
FIG. 2D is a top view of a simplified version of the layer prepared as in FIG. 2C.
Figure 2E:
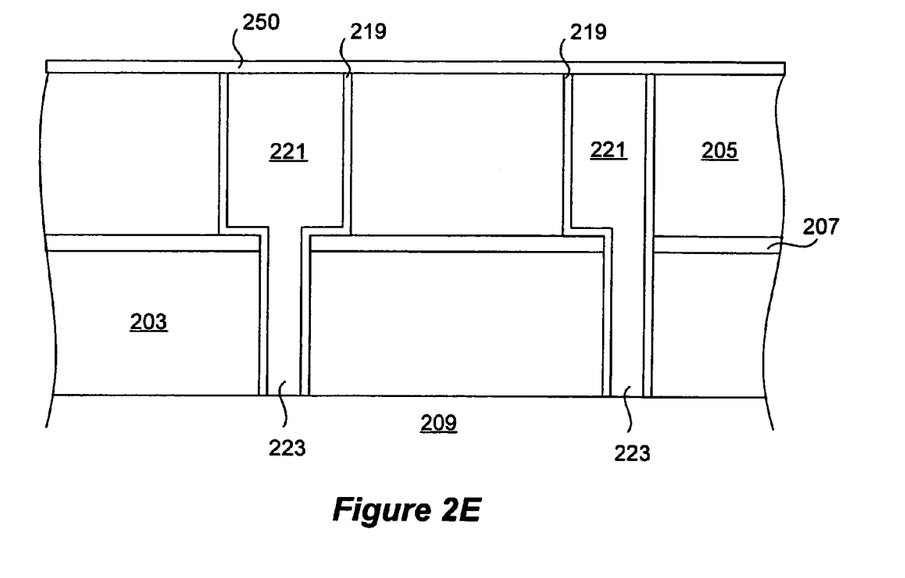
FIG. 2E is a cross sectional diagram of a portion of a semiconductor device including a copper diffusion barrier film.
Figure 3:
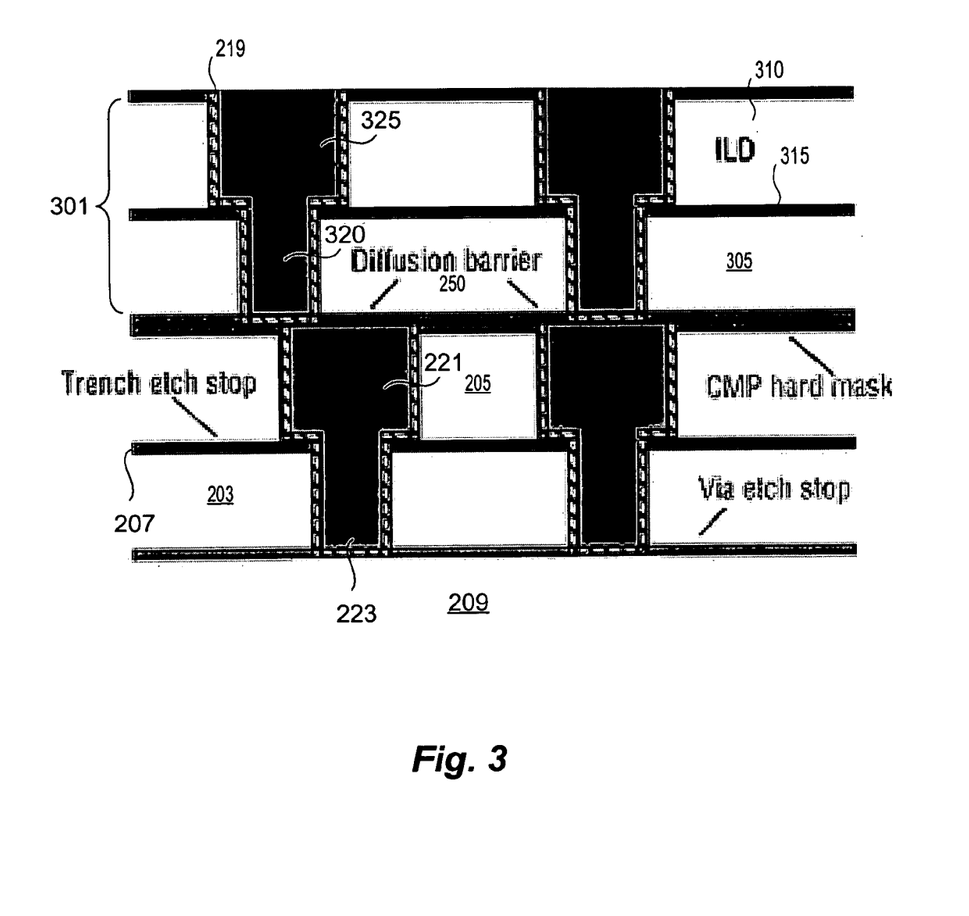
FIG. 3 is a cross sectional diagram of a portion of a semiconductor device formed by a dual damascene process.

As an overview of the following drawings, FIGS. 2A through 2D depict a dual damascene approach to operations 103 and 105 of FIG. 1. FIG. 2E illustrates step 109. FIG. 3 illustrates step 111.

In a typical dual damascene process, first and second layers of dielectric are deposited in succession, possibly separated by deposition of an etch stop layer, such as a silicon nitride layer. These layers are depicted in FIG. 2A as first dielectric layer 203, second dielectric layer 205, and etch stop layer 207. These are formed on an adjacent portion of a substrate 209, which portion may be an underlying metallization layer or a gate electrode layer (at the device level).

After deposition of the second dielectric layer 205, the process forms a via mask 211 having openings where vias will be subsequently etched. Next, the vias are partially etched down through the level of etch stop 207. Then via mask 211 is stripped off and replaced with a line mask 213 as depicted in FIG. 2B. A second etch operation is performed to remove sufficient amounts of dielectric to define line paths 215 in second dielectric layer 205. The etch operation also extends via holes 217 through first dielectric layer 203, down to contact the underlying substrate 209. See FIG. 2B.

Thereafter, the process forms a thin layer of conductive barrier layer material 219 on the exposed surfaces (including sidewalls) of dielectric layers 203 and 205. Conductive barrier layer material 219 may be formed, for example, of tantalum nitride. A CVD or PVD operation is typically employed to deposit conductive barrier layer material 219.

On top of the barrier layer, the process deposits conductive metal (typically copper) in the via holes and line paths 217 and 215. Conventionally this deposition is performed in two steps: an initial deposition of a conductive seed layer followed by bulk deposition of copper by electroplating. The seed layer may be deposited by physical vapor deposition, chemical vapor deposition, electroless plating, etc. Note that the bulk deposition of copper not only fills line paths 215 but, to ensure complete filling, covers all the exposed regions on top of second dielectric layer 205.

Thus, it becomes necessary to planarize the structure and remove the excess copper from the device. Planarization removes material down to the level of the top of dielectric layer 205. This results in an exposed pattern of conductive lines 221 in dielectric layer 205 and vias in dielectric layer 203. (See the cross-sectional view of FIG. 2C and the simplified top view of FIG. 2D.)

Planarization may be accomplished by various techniques. Typically, the process involves some amount of chemical mechanical polishing (CMP). It may also involve a combination of electropolishing, to remove most of the excess bulk copper, followed by CMP to remove the remaining copper down to the level of the top surface of dielectric layer 205.

Dielectric layers 203 and 205 are preferably made from a dielectric material that has sufficient mechanical strength to resist damage during CMP or other pressure-based operation. Further, the dielectric material preferably, though not necessarily, has a relatively low intrinsic dielectric constant; e.g., below about 5. Examples include silicon dioxide (4.2), fluorinated silicate glass (3.6–3.7), silicon oxycarbide (2.7–3.1) and the like. Generally, these dielectric layers can be prepared by techniques well known to those of skill in the art such as CVD and spin on techniques. However, the dielectric material may be made porous to further reduce its dielectric constant, e.g., by using the methods described in U.S. patent application Ser. No. 10/171,289, attorney docket number NOVLP050, which is hereby incorporated by reference in its entirety.

After removing the excess copper, one of the films of the present invention are formed as a copper diffusion barrier, preferably by using one of the plasma-enhanced chemical vapor deposition techniques described above. Copper diffusion barrier film 250 of FIG. 2E is one such film. Preferably, copper oxide is removed from the copper, e.g., by flowing ammonia gas and/or hydrogen gas with plasma, prior to depositing copper diffusion barrier film 250. Copper diffusion barrier film 250 preferably has a thickness in the range of 100 Å to 1500 Å.

FIG. 3 illustrates a partially-formed semiconductor device wherein the foregoing steps have been repeated to form upper layers 301. Dielectric layers 305 and 310 are separated by etch stop layer 315. Upper layers 301 also include vias 320 and lines 325.

OTHER EMBODIMENTS

While this invention has been described in terms of a few preferred embodiments, it should not be limited to the specifics presented above. Many variations on the above-described preferred embodiments may be employed. For example, according to other aspects of the invention, a boron nitride layer is formed, then a moisture barrier is formed on the boron nitride layer. Moreover, while the invention has been described primarily in terms of preparing integrated circuits, it is not so limited.

Therefore, the invention should be broadly interpreted with reference to the following claims.

We claim:
1. A method of forming at least a portion of a semiconductor device, the method comprising:
   forming a trench in a first dielectric layer;
   depositing a metal diffusion barrier in the trench;
   depositing a copper seed layer on the metal diffusion barrier;
   forming a copper interconnect on the copper seed layer; and
   forming a copper diffusion barrier on the copper interconnect, the copper diffusion barrier formed of a silicon-based material doped with boron.
2. The method of claim 1, further comprising:
   removing copper oxide from the copper layer prior to forming the copper diffusion barrier on the copper layer.
3. The method of claim 1, wherein the step of forming a copper diffusion barrier comprises a plasma-enhanced chemical vapor deposition technique.

4. The method of claim 1, wherein the step of forming a copper diffusion barrier comprises flowing silane gas at rates in the range of approximately 50 to 300 standard cubic centimeters per minute.

5. The method of claim 4, wherein the step of forming a copper diffusion barrier comprises flowing diborane gas at rates in the range of approximately 2000 to 10000 standard cubic centimeters per minute.

6. The method of claim 5, wherein the step of forming a copper diffusion barrier comprises flowing ammonia gas at rates in the range of approximately 250 to 2000 standard cubic centimeters per minute or flowing nitrogen gas at rates in the range of approximately 0 to 8000 standard cubic centimeters per minute.

7. The method of claim 5, wherein the step of forming a copper diffusion barrier comprises:
flowing silane gas at approximately 50 standard cubic centimeters per minute;
flowing a diborane/argon gas mixture at approximately 9000 standard cubic centimeters per minute; and
flowing ammonia gas at approximately 500 standard cubic centimeters per minute.

8. The method of claim 1, wherein the removing step comprises exposing the copper layer to a gas selected from a list consisting of ammonia gas and hydrogen gas.

9. The method of claim 1, wherein the plasma-enhanced chemical vapor deposition technique is performed at temperatures in the range of approximately 200 degrees Centigrade to 400 degrees Centigrade.

10. The method of claim 3, wherein the plasma-enhanced chemical vapor deposition technique is performed at pressures in the range of approximately 0.1 torr to 10 torr.

11. The method of claim 3, wherein the plasma-enhanced chemical vapor deposition technique is performed at frequencies in the range of approximately 200 to 500 kHz.

12. The method of claim 3, wherein the plasma-enhanced chemical vapor deposition technique is performed at a frequency of approximately 13.56 MHz or approximately 27 MHz.

13. The method of claim 1, wherein the step of forming a copper diffusion barrier comprises using a borane complex for a boron source.

14. The method of claim 13, wherein the borane complex comprises dimethylamine borane or trimethyl borane.

* * * * *

UNITED STATES PATENT AND TRADEMARK OFFICE
CERTIFICATE OF CORRECTION

PATENT NO. : 7,163,889 B2 Page 1 of 1
APPLICATION NO. : 11/234808
DATED : January 16, 2007
INVENTOR(S) : Yu et al.

It is certified that error appears in the above-identified patent and that said Letters Patent is hereby corrected as shown below:

Column 7, line 23 change "claim 1" to --claim 2--.

Column 8, line 1 change "claim 1" to --claim 2--.

Signed and Sealed this

Twenty-third Day of October, 2007

JON W. DUDAS
*Director of the United States Patent and Trademark Office*